United States Patent
Bafna et al.

(10) Patent No.: US 12,341,425 B2
(45) Date of Patent: Jun. 24, 2025

(54) POWER CONVERTER CONTROL WITH PROGRAMMABLE BLANKING TIME

(71) Applicant: TEXAS INSTRUMENTS INCORPORATED, Dallas, TX (US)

(72) Inventors: Naman Bafna, Balaghat (IN); Muthusubramanian Venkateswaran, Bangalore (IN); Mayank Jain, Ambala Catt (IN); Vikram Gakhar, Bangalore (IN); Vikas Lakhanpal, Bengaluru (IN); Preetam Charan Anand Tadeparthy, Bangalore (IN); Pamidi Ramasiddaiah, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/376,230

(22) Filed: Oct. 3, 2023

(65) Prior Publication Data

US 2024/0039402 A1 Feb. 1, 2024

Related U.S. Application Data

(63) Continuation of application No. 17/138,484, filed on Dec. 30, 2020, now Pat. No. 11,811,314.

(51) Int. Cl.
*H02M 3/155* (2006.01)
*H02M 1/08* (2006.01)
*H03K 5/24* (2006.01)

(52) U.S. Cl.
CPC ........... *H02M 3/155* (2013.01); *H02M 1/08* (2013.01); *H03K 5/24* (2013.01)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS 5,229,707 A * 7/1993 Szepesi ............... H02H 7/1213
361/18
5,821,740 A * 10/1998 Hodgins ................ G05F 1/573
361/57
(Continued)

FOREIGN PATENT DOCUMENTS

CN 113728542 3/2020
EP 2424097 A2 2/2012
(Continued)

OTHER PUBLICATIONS

Search Report for PCT Application No. PCT/US2021/065269, date of mailing of the international search report Apr. 28, 2022, 1 page.

*Primary Examiner* — Sean Kayes
*Assistant Examiner* — Nusrat Quddus
(74) *Attorney, Agent, or Firm* — Valerie M. Davis; Frank D. Cimino

(57) ABSTRACT

In some examples, a circuit includes a state machine. The state machine is configured to operate in a first state in which the state machine gates a pulse width modulation (PWM) signal provided for control of a power converter according to a first signal provided by a voltage control loop. The state machine is configured to operate in a second state in which the state machine gates the PWM signal according to a second signal provided by a current limit comparator. The state machine is configured to transition from the first state to the second state responsive to the second signal being asserted after the first signal is asserted in a switching cycle of the power converter. The state machine is configured to transition from the current state to the first state responsive to the first signal being asserted after the second signal in a switching cycle of the power converter.

20 Claims, 3 Drawing Sheets

(58) Field of Classification Search
CPC ... G05F 1/445; G05F 1/66; G05F 1/40; G05F
1/42; G05F 1/44; G05F 1/462; G05F
1/52; G05F 1/56; G05F 3/10; G05F 3/16;
G05F 3/18; G05F 3/185; G05F 3/20;
G05F 3/26; G05F 3/30; G05F 3/205;
G05F 3/22; G05F 3/24; G05F 3/222;
G05F 3/242; G05F 3/225; G05F 3/227;
G05F 3/245; G05F 3/247; G05F 3/262;
G05F 3/265; G05F 3/267; G05F 1/575;
G05F 1/30; G05F 1/33; G05F 1/32; G05F
1/34; G05F 1/38; H02M 5/2573; H02M
1/081; H02M 5/293; H02M 7/12; H02M
3/10; H02M 3/125; H02M 3/13; H02M
3/135; H02M 3/145; H02M 3/15; H02M
3/155; H02M 3/156; H02M 3/158; H02M
3/1588; H02M 2003/1566; H02M 3/1582;
H02M 2003/1557; H02M 3/1584; H02M
3/285; H02M 3/33561; H02M 7/49;
H02M 1/045; H02M 7/006; H02M 7/06;
H02M 7/068; H02M 7/153; H02M 7/10;
H02M 1/088; H02M 7/103; H02M 7/106;
H02M 7/19; H02M 7/08; H02M 7/17;
H02M 2001/007; H02M 7/493; H02M
7/53806; H02M 7/5381; H02M 7/483;
H02M 7/217; H02M 7/538466; H02M
7/5387; H02M 7/53871; H02M 7/53873;
H02M 7/53875; H02M 1/084; H02M
1/0845; H02M 1/12; H02M 3/3155;
H02M 3/33507; H02M 3/33546; H02M
7/1557; H02M 7/1626; H02M 1/4208;
H02M 7/219; H02M 7/151; H02M
1/4233; H02M 5/4585; H02M 1/08;
H02M 7/1552; H02M 7/1623; H02M
1/4225; H02M 3/33592; H02M 3/073;
H02M 3/137; H02M 7/00; H02M 7/064;
H05B 39/048; B23K 11/24; H04B
2215/069; H02J 3/46; H02J 3/38; H02J
7/12
See application file for complete search history.

(56) References Cited

U.S. PATENT DOCUMENTS

| | | | |
|---|---|---|---|
| 5,847,554 A | 12/1998 | Wilcox et al. | |
| 6,307,356 B1 | 10/2001 | Dwelley | |
| 7,764,054 B1 | 7/2010 | Guo et al. | |
| 7,772,904 B1 | 8/2010 | Cooke | |
| 7,868,595 B1 | 1/2011 | Smith | |
| 8,031,491 B2 * | 10/2011 | Djenguerian | H02M 3/33515 363/21.16 |
| 8,686,767 B1 | 4/2014 | Nene | |
| 9,667,145 B1 | 5/2017 | Goenawan et al. | |
| 9,667,146 B1 | 5/2017 | Goenawan et al. | |
| 9,966,832 B1 | 5/2018 | Engelhardt et al. | |
| 10,056,819 B1 | 8/2018 | Couleur et al. | |
| 10,135,341 B1 * | 11/2018 | Liu | H02M 1/32 |
| 10,243,565 B2 | 3/2019 | Aurola | |
| 10,511,226 B1 | 12/2019 | Gurlahosur et al. | |
| 10,845,833 B1 | 11/2020 | Dietrich et al. | |
| 2003/0174005 A1 | 9/2003 | Latham, II et al. | |
| 2005/0007796 A1 * | 1/2005 | So | H02M 3/156 363/41 |
| 2005/0024035 A1 | 2/2005 | Tabaian et al. | |
| 2005/0036245 A1 | 2/2005 | Greenfeld | |
| 2005/0275392 A1 | 12/2005 | Wong et al. | |
| 2006/0022731 A1 * | 2/2006 | Leung | H02M 3/157 327/172 |
| 2007/0133234 A1 * | 6/2007 | Huynh | H02M 3/33507 363/20 |
| 2008/0037297 A1 * | 2/2008 | Torre | H02M 3/33515 363/41 |
| 2008/0123372 A1 * | 5/2008 | Yang | H02M 3/33507 363/21.16 |
| 2009/0016085 A1 | 1/2009 | Rader et al. | |
| 2009/0160414 A1 | 6/2009 | Hachiya et al. | |
| 2010/0066336 A1 | 3/2010 | Araki et al. | |
| 2010/0079124 A1 | 4/2010 | Melanson | |
| 2011/0156684 A1 | 6/2011 | da Silva et al. | |
| 2011/0157756 A1 | 6/2011 | Zanardi et al. | |
| 2012/0153921 A1 * | 6/2012 | Brokaw | H02M 3/156 323/288 |
| 2013/0063984 A1 | 3/2013 | Sandner et al. | |
| 2013/0272035 A1 | 10/2013 | Strzalkowski | |
| 2014/0217999 A1 | 8/2014 | Wibben et al. | |
| 2014/0239925 A1 | 8/2014 | Tanabe et al. | |
| 2014/0292292 A1 | 10/2014 | Koski | |
| 2015/0229160 A1 | 8/2015 | Kawakami et al. | |
| 2015/0288285 A1 | 10/2015 | Paul et al. | |
| 2015/0381044 A1 | 12/2015 | Bodano et al. | |
| 2016/0322834 A1 | 11/2016 | Carpenter, Jr. et al. | |
| 2016/0359320 A1 * | 12/2016 | Bisogno | H02M 1/32 |
| 2017/0040895 A1 | 2/2017 | May et al. | |
| 2017/0257031 A1 | 9/2017 | Shao et al. | |
| 2018/0091051 A1 | 3/2018 | Langlinais et al. | |
| 2018/0262096 A1 * | 9/2018 | Hsu | H02M 3/33507 |
| 2019/0115835 A1 | 4/2019 | Cohen | |
| 2019/0222122 A1 | 7/2019 | Langlinais et al. | |
| 2019/0296630 A1 | 9/2019 | Low et al. | |
| 2019/0305676 A1 | 10/2019 | Dietrich et al. | |
| 2020/0228012 A1 | 7/2020 | Lynch et al. | |
| 2020/0321872 A1 | 10/2020 | Upadhyaya | |
| 2021/0006158 A1 | 1/2021 | Neyra et al. | |
| 2021/0099082 A1 | 4/2021 | Romeo | |
| 2021/0099116 A1 * | 4/2021 | Krishnamurthy | H02P 7/04 |
| 2021/0234457 A1 | 7/2021 | Silva et al. | |
| 2021/0313887 A1 | 10/2021 | Mariani | |
| 2022/0321004 A1 | 10/2022 | Plojhar | |
| 2022/0393588 A1 | 12/2022 | Bafna et al. | |
| 2023/0035151 A1 * | 2/2023 | Balaji | H02M 3/1566 |

FOREIGN PATENT DOCUMENTS

| | | |
|---|---|---|
| EP | 3907866 A1 | 11/2021 |
| IT | 102020000006871 | 4/2020 |
| WO | 03079527 A2 | 9/2003 |

* cited by examiner

POWER CONVERTER CONTROL WITH PROGRAMMABLE BLANKING TIME

CROSS-REFERENCE TO RELATED APPLICATION

This application is a continuation of U.S. application Ser. No. 17/138,484 filed Dec. 30, 2020, which is hereby incorporated herein by reference in its entirety.

BACKGROUND

A switched mode power supply (SMPS) transfers power from an input power source to a load by switching one or more power transistors or other switching elements coupled through a switch node/terminal to an energy storage element (such as an inductor, an inductance of a transformer, and/or a capacitor), which is capable of coupling to the load. The power transistors can be included in a power converter that includes, or is capable of coupling to, the energy storage element. A SMPS can include a SMPS controller to provide one or more gate drive signals to switch the power transistor(s). Switching of the power transistor(s) can be controlled based on a current flowing through the power converter.

SUMMARY

In some examples, a circuit includes a state machine. The state machine is configured to operate in a first state in which the state machine gates a pulse width modulation (PWM) signal provided for control of a power converter according to a first signal provided by a voltage control loop. The state machine is configured to operate in a second state in which the state machine gates the PWM signal according to a second signal provided by a current limit comparator. The state machine is configured to transition from the first state to the second state responsive to the second signal being asserted after the first signal is asserted in a switching cycle of the power converter. The state machine is configured to transition from the current state to the first state responsive to the first signal being asserted after the second signal in a switching cycle of the power converter.

In some examples, a circuit includes a first comparator, a current sense element, a second comparator, and a state machine. The first comparator has a first output, a first input, and a second input, the first input adapted to be coupled to an output of a power converter and the second input configured to receive a voltage ramp signal. The current sense element has a current sense input and a current sense output, the current sense input adapted to be coupled to a power converter. The second comparator has a second output, a third input, a fourth input, and a blanking input, the third input coupled to the current sense output, the fourth input configured to receive a current limit threshold signal, and the blanking input configured to receive a blanking signal. The state machine is coupled to the first output and the second output and configured to provide a PWM signal for controlling the power converter based on a signal at the first output and a signal at the second output.

In some examples, a system includes a load and a switched mode power supply (SMPS). The SMPS is coupled to the load and including a power converter configured to switch power to the load based on control exerted by the SMPS. The SMPS is configured to implement a state machine configured to operate in a first state in which the state machine gates a PWM signal provided for control of a power converter according to a first signal. The state machine is configured to operate in a second state in which the state machine gates the PWM signal according to a second signal. The state machine is configured to transition from the first state to the second state responsive to the second signal being asserted after the first signal is asserted in a switching cycle of the power converter. The state machine is configured to transition from the current state to the first state responsive to the first signal being asserted after the second signal in a switching cycle of the power converter.

DETAILED DESCRIPTION

Figure 1:
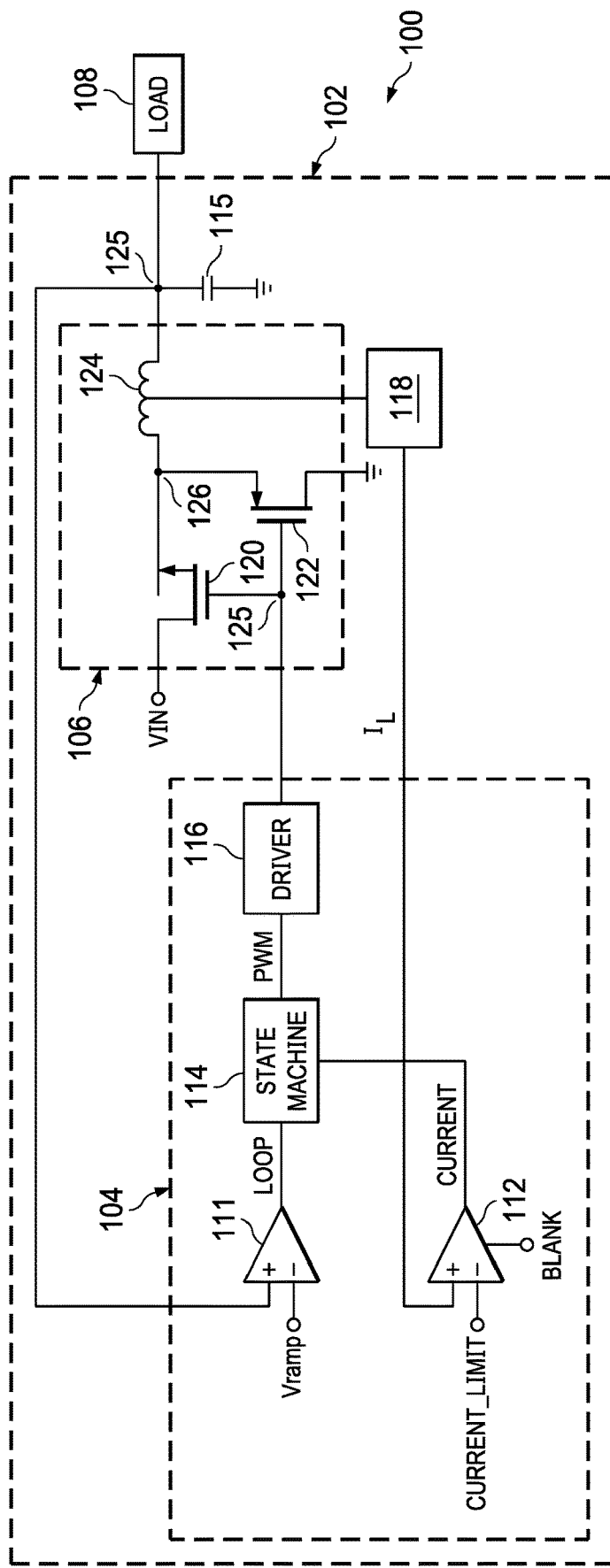
FIG. 1 is a block diagram of an example system.

In some device architectures, a switched mode power supply (SMPS) includes, or is capable of coupling to, an output capacitor in parallel with the load. A SMPS controller switches power transistor(s) to form circuit arrangements with energy storage element(s) to supply a load current to the load and/or to the output capacitor to maintain a regulated output voltage. Alternatively, though not shown herein, at least some of the power transistors may be implemented as passive switches, such as diodes. A power transistor can be coupled through the switch node/terminal to an energy storage inductor during charging and/or discharging switching states of a power converter. In at least some examples, the energy storage inductor is switched by the SMPS controller between charge and discharge switching states to supply inductor current (e.g., current through the energy storage inductor) to the load and to the output capacitor to maintain the regulated output voltage. As described above, in at least some examples, one or more of the power transistors are replaced by passive switches that react based on characteristics of a received input signal and are not switched by the SMPS controller. In some examples, a SMPS can be configured for operation as a constant current source with an energy storage element but with no output capacitor. Power converters periodically repeat sequences of switching states (such as "on" and "off" states). A single on/off cycle may be called a switching cycle.

The power transistors can be implemented as field effect transistors (FETs), such as metal-oxide field effect transistors (MOSFETs) or any other suitable solid-state transistor devices (e.g., such as bipolar junction transistors (BJTs)). Power converters can be of various architectures, each having certain functionality, such as buck, boost, and buck-boost, among others. Depending on the application in which a buck-boost converter is used, the input voltage (VIN) and/or the output voltage (VOUT) of the power converter may vary. To address this, the SMPS controller will control the buck-boost converter to operate in different modes of operation. For example, based on VIN being greater than VOUT, the SMPS controller will cause the power converter to operate in a buck mode of operation. Based on VIN being less than VOUT, the SMPS controller will cause the power converter to operate in a boost mode of operation. Based on VIN being approximately equal to VOUT, the SMPS controller will cause the power converter to operate in a buck-boost mode of operation, or in alternate cycles of buck-mode and boost-mode operation. The above examples are non-exclusive and apply generally to a power converter of buck-boost topology or architecture. However, at least some of the above examples also apply to power converters of other topologies or architectures, such as buck or boost, operating under certain modes of control.

To control a mode of operation of the power converter, the SMPS controller provides gate control signals to one or more power transistors of the power converter. The gate control signals received by a power transistor control whether the power transistor is in a conductive state (e.g., turned on) or in a non-conductive state (e.g., turned off). Each state of a power converter involves a specific combination of transistors that are in conducting states and transistors that are in non-conducting states. To change a mode of operation of the power converter, the SMPS controller modifies the sequence of switching states that it commands the transistors to assume. In at least some examples, the SMPS controller implements a state machine or other logic such that values of the gate control signals are determined based on a mode of operation of or for the power converter. Also, while remaining in a mode of operation of the power converter, the SMPS controller may modify a value of one or more of the gate control signals to alternatively turn on and turn off one or more power transistors.

In some examples, the energy storage element may become saturated. For example, when the energy storage element is an inductor, the energy storage element may become saturated such that magnetic flux of the inductor does not incrementally increase as current through the inductor increases. Saturation of an inductor in this manner creates a potential for an uncontrolled increase in inductor current. The uncontrolled increase in inductor current, in turn, has a potential for damaging, or otherwise adversely affecting, a load receiving VOUT from the SMPS. Further, repeated saturation of an inductor can cause operational characteristics of the inductor to change (such as its saturation point) and may damage or adversely affect the inductor. To protect against saturation of the energy storage element, current limits may be implemented in the SMPS. For example, the SMPS may implement valley or peak sensed current limits for the energy storage element. However, control based on sensed current limits can sometimes have certain disadvantages, such as at low duty cycle operation or while operating at high switching frequencies. For example, in each operational circumstance, a delay between sensing a current and making a control decision based on the sensed current may be greater than an available amount of time before the SMPS controller has provided a pulse width modulation (PWM) signal that causes a current of the energy storage element to overshoot the programmed current limit.

Described herein are various examples of a control scheme for controlling a power converter. In some examples, the power converter may be a component of a SMPS. The control scheme may be implemented in a controller that may also be a component of the SMPS or may be adapted to be coupled to the SMPS. For example, the controller may implement a state machine, such as a digital finite state machine, to control the power converter according to the control scheme of this description. In at least some examples of the control scheme of this description, two operation modes are defined. The first operation mode is a normal operation mode and the second operation mode is a current limit operation mode. In at least some examples, the state machine may receive input signals from a PWM comparator that compares a signal having a value based on an output voltage of the power converter to a reference signal, such as a voltage ramp signal (Vramp). The state machine may also receive input signals from a current limit comparator that compares a sensed current of an energy storage element of the power converter to a programmed current limit threshold. The PWM comparator may provide a signal LOOP and the current limit comparator may provide a signal CURRENT, each of which is an active low signal for the purposes of this description.

The current limit comparator may be gated by a blanking signal (BLANK), which is also an active low signal for the purposes of this description. For example, while BLANK is asserted, the current limit comparator may be prevented from providing CURRENT as having an asserted value, irrespective of values of the sensed current of the energy storage element of the power converter or the current limit threshold. By modifying an amount of time for which BLANK is asserted, the current limit comparator may be blocked for the programmed time of BLANK, irrespective of a minimum on time of the power converter. The programmed time may be based on a switching frequency of the power converter, thereby increasing accuracy of current limit control of the power converter, such as by increasing noise immunity of control of the power converter. In some examples, assertion of BLANK may further take into consideration other circuit conditions. For example, whether or not to assert BLANK may be at least partially determined according to a sensor output, signal, various programmed circuit protection or operation schemes, etc. For example, a microcontroller or other processing component(s), such as digital logic devices, may receive signals and provide BLANK having a value determined based on those received signals and a particular use case in which BLANK is used.

In at least some examples, the state machine may be configured to provide a PWM signal having an asserted value responsive to a second of LOOP and CURRENT becoming asserted during a switching cycle of the power converter. During the normal operation mode described above, a PWM signal provided by the state machine for firing a pulse of the power converter is gated by LOOP. For example, CURRENT may become asserted followed by LOOP becoming asserted. In at least some examples, CURRENT may only become asserted while BLANK is also asserted. In the normal operation mode, the PWM signal provided by the state machine may become asserted based on LOOP becoming asserted. Also, while operating in the normal operation mode, BLANK may become asserted at a falling edge (e.g., deassertion) of the PWM signal provided by the state machine and may become deasserted responsive to CURRENT becoming deasserted. If CURRENT becomes asserted after LOOP becomes asserted, the PWM signal provided by the state machine may become asserted based on the assertion of OCP_RAW and the state machine may move to the current limit operation mode. In the current limit operation mode, the PWM signal provided by the state machine may become asserted based on CURRENT becoming asserted. Also while operating in the current limit operation mode, an amount of time for which BLANK is asserted may be programmable to prevent OCP_BLANK from becoming asserted during the programmed amount of time. If LOOP becomes asserted after CURRENT becomes asserted, the PWM signal provided by the state machine may again become asserted based on the assertion of LOOP and the state machine may return to the normal operation mode. In at least some examples, the programmability of BLANK facilitates operation of the power converter across various switching frequencies, providing for accurate control based on CURRENT while limiting adverse effects to transient performance of the power converter.

FIG. 1 shows a block diagram of an example system 100. In at least one example, the system 100 includes a SMPS 102 that includes a controller 104 and a power converter 106. The SMPS 102, through the power converter 106, switches power provided to the SMPS 102 as VIN to a load 108. In some examples, the SMPS is adapted to be coupled to the load 108 at an output terminal of the SMPS 102. In some examples, the power converter 106 is a buck power converter. In other examples, the power converter 106 is a buck-boost power converter that is capable of operating according to a buck mode of operation, a boost mode of operation, and/or a buck-boost mode of operation. In other examples, the power converter 106 is a boost power converter. A buck power converter implementation is assumed for description herein. In at least one example, the controller 104 includes, or is adapted to be coupled to, a PWM comparator 111, a current limit comparator 112, and a state machine 114. In some examples, the power converter 106 is also adapted to be coupled to a capacitor 115. The controller 104 may further include, or be adapted to be coupled to, a driver 116 and a current sense element 118. In other examples, the current sense element 118 is a component of the power converter 106. The power converter 106 includes a power transistor 120, a power transistor 122, and is adapted to be coupled to an inductor 124. The SMPS 102 of this description is shown and described as implementing valley mode constant on time control over the power converter 106. However, other control methods are possible, such as peak current mode control, average current mode control, voltage mode control, or any other suitable form of control implemented in a fixed frequency method, variable frequency method, constant time method (e.g., constant Ton or constant Toff), etc.

At least one example of the SMPS 102 includes at least some aspects of the controller 104 and the power converter 106 on a same semiconductor die and/or in a same component package (or encapsulation), while in other examples the controller 104 and the power converter 106 may be fabricated separately and adapted to be coupled together. For example, at least some aspects of the controller 104 may be fabricated separately and coupled together. Accordingly, while shown as including the driver 116, in at least one example the controller 104 does not include the driver 116, but rather is adapted to be coupled to the driver 116. Similarly, other components shown as being included in the controller 104 may be adapted to be coupled, in whole or in part, to the controller 104 and not be included on a same semiconductor die and/or in a same component package as the controller 104. Similarly, components shown or described in this description as being included in the power converter 106 (such as an inductor) may be adapted to be coupled, in whole or in part, to the power converter 106 and not be included on a same semiconductor die and/or in a same component package as the power converter 106.

In at least one example architecture of the system 100, the PWM comparator 111 has a first input terminal (e.g., a positive or non-inverting input terminal), a second input terminal (e.g., a negative or inverting input terminal), and an output terminal. The first input terminal of the PWM comparator 111 is coupled to a node 125 at which VOUT is provided, the second input terminal of the PWM comparator 111 is configured to receive Vramp, and the output terminal of the PWM comparator 111 is coupled to the state machine 114. In at least some examples, the node 125 is the output terminal of the SMPS 102. In at least some examples, one or more components or circuits are coupled between the first input terminal of the PWM comparator 111 and the node 125, such as a loop compensation circuit or component, a slope compensation circuit or component, etc. The current limit comparator 112 has a first input terminal (e.g., a positive or non-inverting input terminal), a second input terminal (e.g., a negative or inverting input terminal), and an output terminal. The first input terminal of the current limit comparator 112 is coupled to the current sense element 118, the second input terminal of the current limit comparator 112 is configured to receive a current limit threshold signal (indicated in FIG. 1 as CURRENT_LIMIT), and the output terminal of the current limit comparator 112 is coupled to the state machine 114. The current limit comparator 112 further has a control input configured to receive BLANK. The state machine 114 has an output terminal adapted to be coupled to an input terminal of the driver 116, which has an output terminal adapted to be coupled to a node 125. The capacitor 115 is adapted to be coupled between the node 125 and ground. The power transistor 120 has a gate terminal adapted to be coupled to the node 125, a drain terminal configured to receive VIN, and a source terminal coupled to a node 126. The power transistor 122 has a gate terminal adapted to be coupled to the node 125, a drain terminal adapted to be coupled to ground, and a source terminal coupled to the node 126. The inductor 124 is adapted to be coupled between the node 126 and the node 125. The current sense element 118 is adapted to be coupled to, or otherwise sense a current of, the inductor 124. In at least some examples, the controller 104, or any one or more components of the controller 104, and/or the current sense element 118 may be collectively referred to as a voltage control loop, such that a voltage provided at the node 125 (or PWM, on which the voltage provided at the node 125 is based) is controlled by the voltage control loop.

In an example of operation of the system 100, the state machine 114 provides PWM based on decisions that are made by the state machine 114 based at least partially on LOOP and CURRENT. Based on PWM, the driver 116 is configured to drive the power transistor 120 and the power transistor 122. For example, responsive to assertion of PWM, the driver 116 is configured to drive the power transistor 120 to cause the power transistor 120 to be conductive, conducting current from a power source from which VIN is received to the node 126 to energize the inductor 124. While PWM is asserted, the driver 116 is also configured to drive the power transistor 122 to cause the power transistor 122 to be non-conductive between the node 126 and ground. Responsive to deassertion of PWM, the driver 116 is configured to drive the power transistor 120 to cause the power transistor 120 to be non-conductive between the power source from which VIN is received and the node 126. Also while PWM is deasserted, the driver 116 is configured to drive the power transistor 122 to cause the power transistor 122 to be conductive between the node 126 and ground to de-energize the inductor 124.

The PWM comparator 111 receives a signal representative of VOUT (or, in some examples, receives VOUT) at the first input terminal of the PWM comparator 111. The PWM comparator 111 compares the signal representative of VOUT to Vramp. Responsive to the signal representative of VOUT having a value that does not exceed a value of Vramp, the PWM comparator 111 provides LOOP having an asserted value. Responsive to the signal representative of VOUT having a value that exceeds the value of Vramp, the PWM comparator 111 provides LOOP having a deasserted value. The current limit comparator 112 receives a signal, shown in FIG. 1 as IL, representative of an inductor current of the inductor 124 from the current sense element 118 at the first input terminal of the current limit comparator 112. The current limit comparator 112 compares IL to CURRENT_LIMIT. Responsive to IL having a value that does not exceed CURRENT_LIMIT, and while BLANK has an asserted value, the current limit comparator 112 provides CURRENT having an asserted value. Responsive to IL having a value that exceeds CURRENT_LIMIT, and while BLANK has an asserted value, the current limit comparator 112 provides CURRENT having a deasserted value. Responsive to BLANK having a deasserted value, the current limit comparator 112 provides CURRENT having a deasserted value.

In at least some examples, the state machine 114 is configured to provide PWM having an asserted value responsive to a second of LOOP and CURRENT being received having an asserted value. Operation of the state machine 114 is further described below with respect to FIG. 2.

Figure 2:
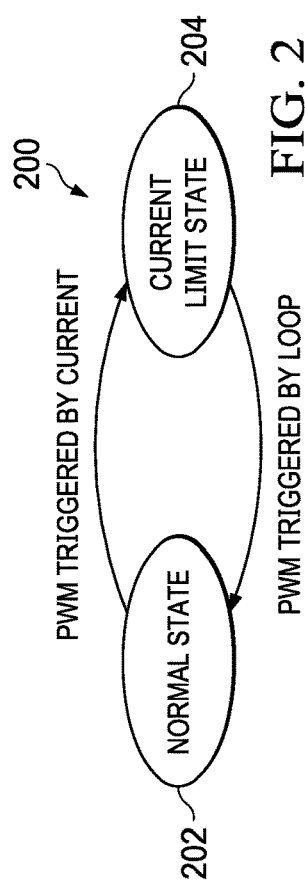
FIG. 2 is an example state diagram of a state machine.

FIG. 2 shows an example state diagram 200 of the state machine 114. The state diagram 200, in at least some examples, represents states and state transitions of at least one implementation of the state machine 114 of FIG. 1. At least some examples of the state machine 114 are configured to implement a normal state 202 and a current limit state 204.

While operating in the normal state 202, the state machine 114 is configured to control the power converter 106 to operate in a normal operation mode in which the state machine 114 gates PWM according to LOOP. For example, while operating in the normal state 202, in a given switching cycle of the power converter 106 the state machine 114 may receive LOOP having an asserted value after having already received CURRENT having an asserted value in the same switching cycle. Based on receiving LOOP as the second of LOOP and CURRENT to be asserted, the state machine 114 provides PWM having an asserted value. In some examples of operation in the normal state 202, the state machine 114 receives CURRENT as the second of LOOP and CURRENT to be asserted. Responsive to receiving CURRENT as the second of LOOP and CURRENT to be asserted, the state machine 114 transitions from the normal state 202 to the current limit state 204.

While operating in the current limit state 204, the state machine 114 is configured to control the power converter 106 to operate in a current limit operation mode in which the state machine 114 gates PWM according to CURRENT. For example, while operating in the current limit state 204, in a given switching cycle of the power converter 106 the state machine 114 may receive CURRENT having an asserted value after having already received LOOP having an asserted value in the same switching cycle. Based on receiving CURRENT as the second of LOOP and CURRENT to be asserted, the state machine 114 provides PWM having an asserted value. Responsive to the state machine 114 receiving LOOP as the second of LOOP and CURRENT to be asserted, the state machine 114 transitions from the current limit state 204 back to the normal state 202.

Figure 3:
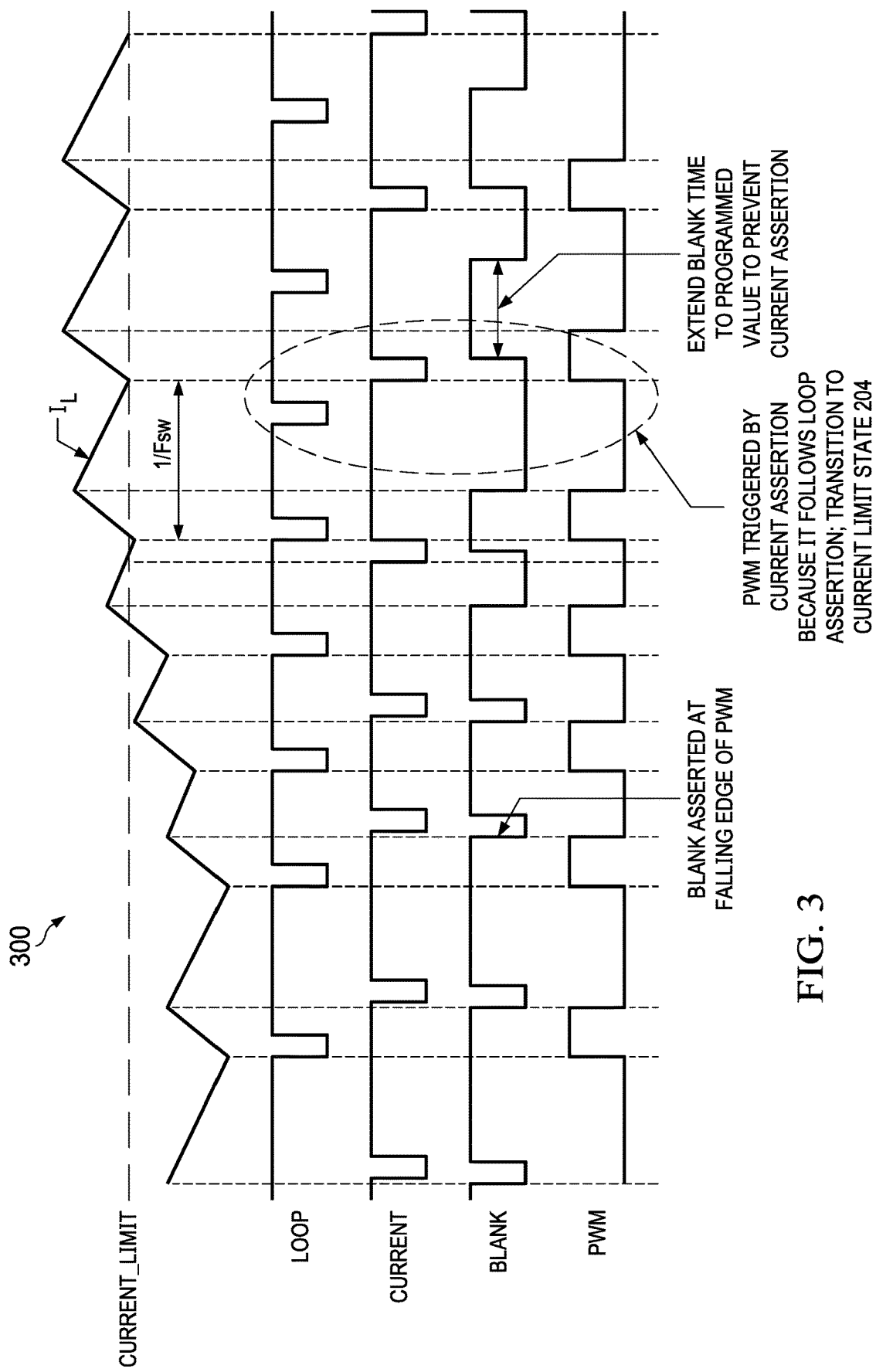
FIG. 3 is an example signal diagram of signals that may be provided in a SMPS.

FIG. 3 shows an example signal diagram 300 of signals that may be provided in the SMPS 102. The signal diagram 300, in at least some examples, shows PWM, BLANK, CURRENT, LOOP, IL, and CURRENT_LIMIT, each as described above. The signal diagram 300, in at least some examples, corresponds to operation of the state machine 114 beginning in the normal state 202 and transitioning to the current limit state 204.

As shown by the signal diagram 300, in the normal state 202, the state machine 114 provides PWM for a pulsed duration based on assertion of LOOP. While operating in the normal state 202, BLANK is configured to be asserted responsive to deassertion (e.g., a falling edge) of PWM. While BLANK is asserted, CURRENT is permitted to be asserted by the current limit comparator 112. For example, while BLANK is asserted and responsive to IL being less than or equal to CURRENT_LIMIT, CURRENT may be asserted for a pulsed duration. While BLANK is not asserted, the current limit comparator 112 is prohibited or blocked from providing CURRENT having an asserted value.

As further shown by the signal diagram 300, responsive to assertion of CURRENT becoming delayed such that it becomes the second of LOOP and CURRENT to be asserted, the state machine 114 provides PWM based on assertion of CURRENT. For example, responsive to a current drawn by the load 108 increasing, IL also increases. As IL increases, assertion of CURRENT begins to be delayed. Similarly, if the current drawn by the load 108 is greater than CURRENT_LIMIT, a frequency of assertion of LOOP may increase to provide a greater amount of energy to the load 108. Responsive to the state machine 114 providing PWM based on assertion of CURRENT, the state machine 114 transitions from the normal state 202 to the current limit state 204, as shown by the signal diagram 300. While operating in the current limit state 204, a time period for which BLANK is not asserted, thereby blocking assertion of CURRENT, is modified according to a programmed value. The programmed value may be determined based on any suitable factors, such as switching frequency of the power converter 106, duty cycle of PWM, board noise for a circuit board including at least some components of the SMPS 102, etc.

In at least some examples, modifying the time period for which BLANK is not asserted provides a degree of noise immunity to the SMPS 102. For example, in a system that does not include BLANK, CURRENT may become asserted responsive to IL momentarily crossing the threshold of CURRENT_LIMIT due to signal noise or other outside influence. In some examples, when an inductor, such as the inductor 124, in a power converter has a high inductance, the inductor may energize and de-energize with a current having a small slope. Such examples may be susceptible to incorrect assertion of CURRENT in the absence of BLANK as described herein. These assertions of CURRENT resulting from signal noise can cause IL to increase beyond a value for which the SMPS 102 is configured, potentially damaging components of the SMPS 102 and/or the load 108. Also, by preventing assertions of CURRENT for a programmable amount of time, the state machine 114 is prevented from providing PWM having an asserted value. In at least some examples, this is advantageous in low-duty cycle or high switching frequency applications of the SMPS 102. For example, in low-duty cycle or high switching frequency applications, a delay may exist between a change in current of the inductor 124 and rendering of a decision (provided as the value of CURRENT) by the current limit comparator 112 based on IL and CURRENT_LIMIT. This delay may mean that by the time the current limit comparator 112 has rendered its decision, the state machine 114 may have already provided another asserted pulse of PWM. However, the state machine 114 may then receive the delayed assertion of CURRENT following PWM becoming deasserted, causing the state machine 114 to provide yet another asserted pulse of PWM shortly after (or immediately following) a minimum off time for the power converter 106 responsive to LOOP being asserted. This may cause a current of the power converter 106 to overshoot, sometimes by large amounts, a programmed value set based on CURRENT_LIMIT, potentially damaging the SMPS 102 and/or the load 108. By preventing assertion of CURRENT for the programmed time according to BLANK, this overshoot may be prevented.

Figure 4:
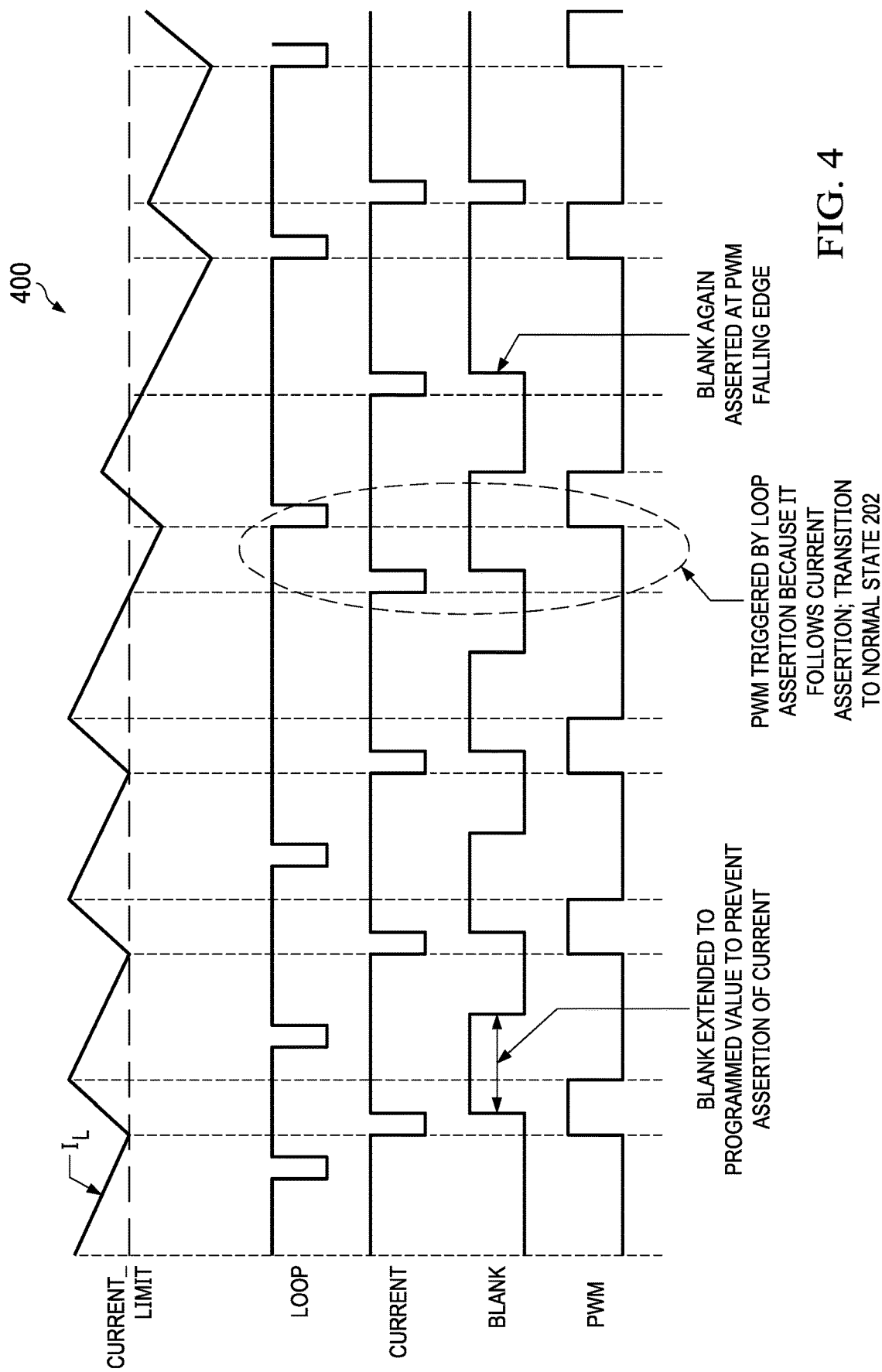
FIG. 4 is an example signal diagram of signals that may be provided in a SMPS.

FIG. 4 shows an example signal diagram 400 of signals that may be provided in the SMPS 102. The signal diagram 400, in at least some examples, shows PWM, BLANK, CURRENT, LOOP, IL, and CURRENT_LIMIT, each as described above. The signal diagram 400, in at least some examples, corresponds to operation of the state machine 114 beginning in the current limit state 204 and transitioning to the normal state 202.

As shown by the signal diagram 400, in the current limit state 204, the state machine 114 provides PWM for a pulsed duration based on assertion of CURRENT. While operating in the current limit state 204, BLANK is configured to be asserted a programmed time after deassertion, which occurs substantially concurrently with deassertion of CURRENT. While BLANK is asserted, CURRENT is permitted to be asserted by the current limit comparator 112. For example, while BLANK is asserted and responsive to IL being less than or equal to CURRENT_LIMIT, CURRENT may be asserted for a pulsed duration. While BLANK is not asserted, the current limit comparator 112 is prohibited or blocked from providing CURRENT having an asserted value. In at least some examples, such blocking prevents the current limit comparator 112 from incorrectly providing multiple assertions of CURRENT substantially back-to-back. Such incorrectly provided multiple assertions of CURRENT may result from an accurate decision of the current limit comparator 112 (and assertion of CURRENT) followed by one or more inaccurate decisions of the current limit comparator 112 (and assertions of CURRENT), such as resulting from a noisiness of IL.

As further shown by the signal diagram 400, responsive to assertion of LOOP becoming delayed such that it becomes the second of CURRENT and LOOP to be asserted, the state machine 114 provides PWM based on assertion of LOOP. Responsive to the state machine 114 providing PWM based on assertion of LOOP, the state machine 114 transitions back from the current limit state 204 to the normal state 202, as shown by the signal diagram 400. While operating in the normal state 202, BLANK may become asserted responsive to deassertion (e.g., a falling edge) of PWM and may become deasserted responsive to deassertion of CURRENT.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example by an end-user and/or a third party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor.

Uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described examples, and other examples are possible, within the scope of the claims.

What is claimed is:

1. A circuit, comprising:
    a logic circuit with a first input, a second input, and an output;
    a first circuit including an input and an output, the input adapted to be coupled to an output of a power converter and the output coupled to the first input of the logic circuit; and
    a second circuit including a first input, a second input, and an output, the first input adapted to receive a current signal of the power converter, the second input adapted to receive a blanking signal, and the output coupled to the second input of the logic circuit;
    wherein:
        the blanking signal is modified based on a programmed value, and
        the programmed value is based on one of a switching frequency of the power converter, a duty cycle of a pulse width modulated signal generated at the output of the logic circuit, and a noise signal of the circuit.

2. The circuit of claim 1, wherein:
    the first circuit is a first comparator;
    the input of the first circuit is a first input; and
    the first comparator including a second input configured to receive a voltage ramp signal.

3. The circuit of claim 2, wherein:
the second circuit is a second comparator;
the second circuit includes a third input; and
the third input configured to receive a current limit signal.

4. The circuit of claim 3, wherein:
in response to a value of the current signal being below the current limit signal and the blanking signal includes an asserted valued, the second circuit provides an output signal having an asserted value at the output of the second circuit.

5. The circuit of claim 3, wherein:
in response to a value of the current signal exceeding the current limit signal and the blanking signal includes an asserted valued, the second circuit provides an output signal having a deasserted value at the output of the second circuit.

6. The circuit of claim 3, wherein:
in response to the blanking signal including a first deasserted value, the second circuit provides an output signal having a second deasserted value at the output of the second circuit.

7. The circuit of claim 1, wherein:
the power converter includes an inductor;
a current sense circuit is coupled to the inductor; and
the current sense circuit is configured to output the current signal of the power converter.

8. A circuit, comprising:
a first input;
a second input;
an output; and
logic configured to:
provide, at the output, a pulse width modulation (PWM) signal in a first state, the PWM signal gated to a first signal received at the first input;
provide, at the output, the PWM signal in a second state, the PWM signal gated to a second signal received at the second input, wherein the second signal is gated by a blanking signal, and wherein an assertion time of the blanking signal is modified based on a programmed value, and wherein the programmed value is based on one of a switching frequency, a duty cycle of the PWM signal, and a noise signal of the circuit;
transition from the first state to the second state responsive to the second signal being asserted after the first signal is asserted in a first switching cycle of the power converter; and
transition from the second state to the first state responsive to the first signal being asserted after the second signal in a second switching cycle of the power converter.

9. The circuit of claim 8, wherein:
the first signal received at the first input is determined from a comparison of an output voltage of the power converter to a voltage ramp.

10. The circuit of claim 8, wherein:
the second signal received at the second input is determined from a comparison of a current flowing through the power converter to a current limit threshold.

11. The circuit of claim 8, wherein:
in the first state, the blanking signal is asserted responsive to deassertion of the PWM signal, and the blanking signal is deasserted a programmed amount of time after assertion.

12. The circuit of claim 8, wherein:
in the second state, the blanking signal is deasserted responsive to deassertion of the second signal and asserted a programmed amount of time after assertion.

13. The circuit of claim 8, wherein:
the second signal is blocked from outputting an asserted value while the blanking signal has an asserted value.

14. A system, comprising:
a power converter; and
a controller coupled to the power converter;
wherein the controller is configured to:
receive a voltage signal from an output of the power converter;
receive a current signal from the power converter;
receive a blanking signal;
operate in a first state to output a pulse width modulation (PWM) signal to the power converter based on a first signal associated with the voltage signal;
operate in a second state to output the PWM signal to the power converter based on a second signal associated with the current signal and the blanking signal, wherein the blanking signal has an assertion time based on a programmed value, and wherein the programmed value is based on one of a switching frequency of the power converter, a duty cycle of the PWM signal, and a noise signal of the controller;
transition from the first state to the second state responsive to the second signal being asserted after the first signal is asserted in a first switching cycle of the power converter; and
transition from the second state to the first state responsive to the first signal being asserted after the second signal in a second switching cycle of the power converter.

15. The system of claim 14, wherein:
the controller includes a first comparator including a first input, a second input, and an output;
the first input configured to receive the voltage signal;
the second input configured to receive a voltage ramp signal; and
the output coupled to a control logic configured to output the PWM signal.

16. The system of claim 15, wherein:
the controller includes a second comparator including a first input, a second input, a third input, and an output;
the first input configured to receive the current signal;
the second input configured to receive a current limit signal;
the third input configured to receive the blanking signal; and
the output coupled to the control logic.

17. The system of claim 16, wherein:
the second comparator is configured to be blocked from providing a second comparator output signal having an asserted value while the blanking signal has an asserted value.

18. The system of claim 16, wherein:
the power converter includes an inductor;
the system further includes a current sense element coupled to the inductor and configured to output the current signal; and
the current sense element is coupled to the first input of the second comparator.

19. The system of claim 14, wherein:
in the first state, the blanking signal is asserted responsive to deassertion of the PWM signal and deasserted a programmed amount of time after assertion.

20. The system of claim 14, wherein:
in the second state the blanking signal is deasserted responsive to deassertion of the second signal and asserted a programmed amount of time after assertion.

* * * * *